(12) United States Patent
Okamoto et al.

(10) Patent No.: US 9,343,338 B2
(45) Date of Patent: May 17, 2016

(54) PICK-UP METHOD OF DIE BONDER AND DIE BONDER

(75) Inventors: Naoki Okamoto, Kumagaya (JP); Keita Yamamoto, Kumagaya (JP)

(73) Assignee: Fasford Technology Co., Ltd., Minami-Alps (JP)

( * ) Notice: Subject to any disclaimer, the term of this patent is extended or adjusted under 35 U.S.C. 154(b) by 252 days.

(21) Appl. No.: 13/224,366

(22) Filed: Sep. 2, 2011

(65) Prior Publication Data

US 2012/0244647 A1    Sep. 27, 2012

(30) Foreign Application Priority Data

Mar. 23, 2011 (JP) ................. 2011-063532

(51) Int. Cl.
*H01L 21/66* (2006.01)
*B32B 38/10* (2006.01)
*H01L 21/67* (2006.01)

(52) U.S. Cl.
CPC .... *H01L 21/67132* (2013.01); *H01L 21/67271* (2013.01); *H01L 2221/68322* (2013.01); *H01L 2221/68336* (2013.01); *H01L 2221/68354* (2013.01); *H01L 2221/68386* (2013.01); *Y10S 156/932* (2013.01); *Y10S 156/943* (2013.01); *Y10T 156/1132* (2015.01); *Y10T 156/1179* (2015.01); *Y10T 156/1944* (2015.01); *Y10T 156/1983* (2015.01)

(58) Field of Classification Search
CPC .......... H01L 2221/68381; H01L 2221/68386; H01L 2221/68318; H01L 2221/68322; H01L 2221/68336; H01L 2221/68354; H01L 21/67271; Y10S 156/932; Y10S 156/943; Y10T 156/1132; Y10T 156/1179; Y10T 156/1944; Y10T 156/1983
USPC ................ 156/707, 716, 758, 765, 932, 943
See application file for complete search history.

(56) References Cited

U.S. PATENT DOCUMENTS

| | | | | |
|---|---|---|---|---|
| 4,556,362 A * | 12/1985 | Bahnck et al. | ............. | 414/744.3 |
| 5,593,926 A | 1/1997 | Fujihira | | |
| 5,605,844 A | 2/1997 | Oki et al. | | |
| 6,629,553 B2 | 10/2003 | Odashima et al. | | |
| 7,265,035 B2 | 9/2007 | Honma et al. | | |
| 8,003,441 B2 | 8/2011 | Maeda et al. | | |
| 8,034,659 B2 | 10/2011 | Nagai et al. | | |
| 8,561,664 B2 * | 10/2013 | Maki et al. | ..................... | 156/758 |

(Continued)

FOREIGN PATENT DOCUMENTS

| | | |
|---|---|---|
| JP | 9-223728 A | 8/1997 |
| JP | 10-275849 | 10/1998 |

(Continued)

OTHER PUBLICATIONS

Korean Office Action corresponding to Korean Patent Appl. No. 10-2011-89441, dated Apr. 16, 2013.

(Continued)

*Primary Examiner* — Mark A Osele
(74) *Attorney, Agent, or Firm* — Crowell & Moring LLP

(57) ABSTRACT

When a die to be stripped out of plural dies (semiconductor chips) bonded to a dicing film is to be tossed and stripped from the dicing film, the dicing film corresponding to predetermined positions out of the peripheral portion of the die is tossed to form stripping start points. The dicing film corresponding to portions other than the above predetermined positions is then tossed to strip the die from the dicing film.

7 Claims, 12 Drawing Sheets

(56) References Cited

U.S. PATENT DOCUMENTS

| | | |
|---|---|---|
| 2002/0069952 A1 | 6/2002 | Kurosawa |
| 2008/0318346 A1* | 12/2008 | Maki et al. ............ 438/7 |

FOREIGN PATENT DOCUMENTS

| | | |
|---|---|---|
| JP | 2001-291726 | 10/2001 |
| JP | 2002-184836 A | 6/2002 |
| JP | 2004-186352 | 7/2004 |
| JP | 2004-241443 A | 8/2004 |
| JP | 2007-42996 A | 2/2007 |
| JP | 2008-98427 A | 4/2008 |
| JP | 2009-27054 A | 2/2009 |
| KR | 10-0278137 | 10/2000 |
| KR | 10-2008-0091730 | 10/2008 |
| TW | 200636888 B | 10/2006 |
| TW | 200641987 B | 12/2006 |
| TW | 200816335 A | 4/2008 |
| TW | 200823137 A | 6/2008 |

OTHER PUBLICATIONS

Taiwanese Office Action dated Apr. 7, 2014 (eight pages).
Japanese Office Action dated Jan. 13, 2015, with English translation (five (5) pages).

* cited by examiner

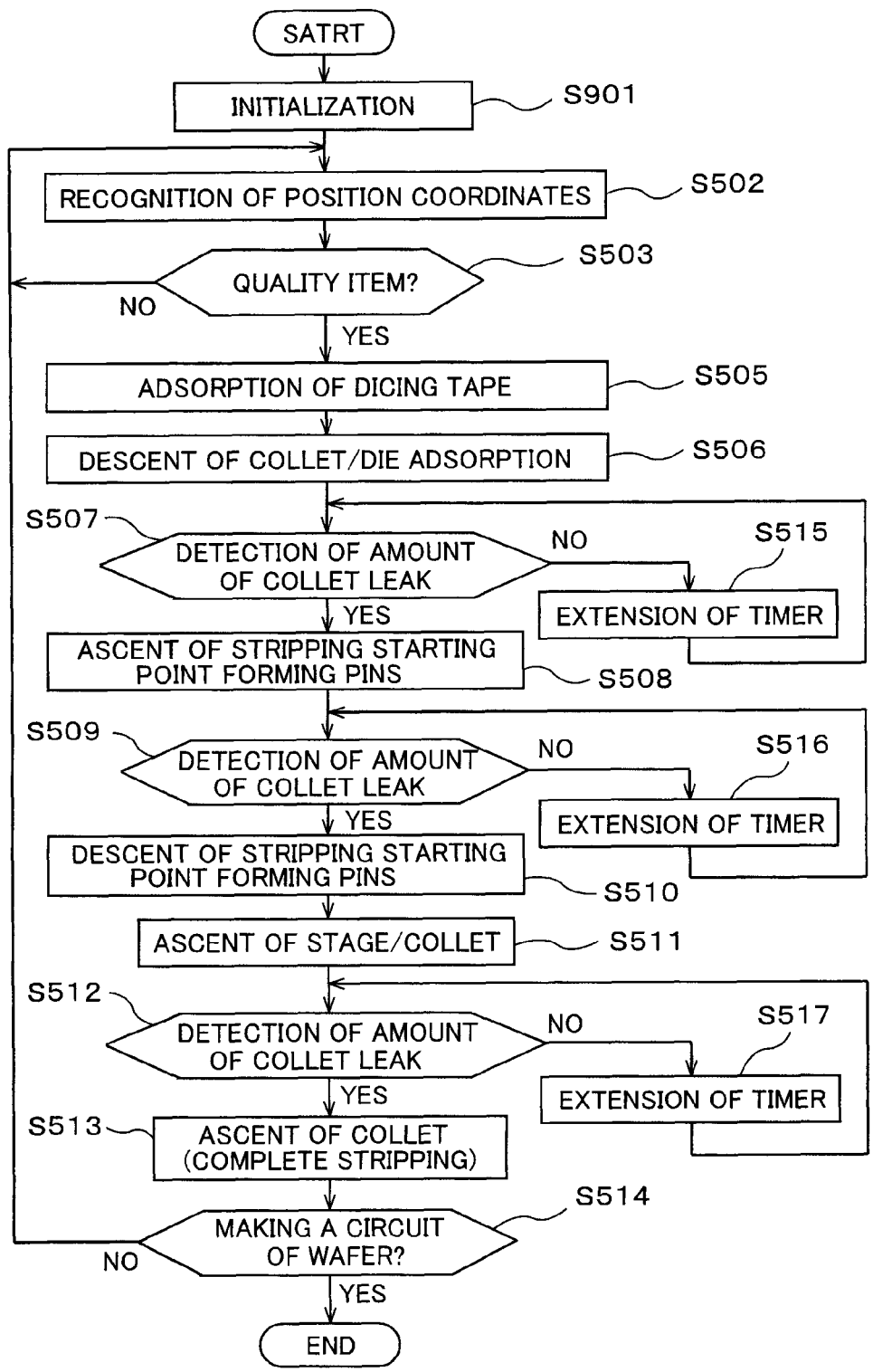

PICK-UP METHOD OF DIE BONDER AND DIE BONDER

BACKGROUND OF THE INVENTION (1) Field of the Invention

The present invention relates to a pick-up method of a die bonder and to a die bonder and, specifically, to a highly reliable pick-up method of a die bonder and to a die bonder capable of stripping a die without fail.

(2) Description of the Related Art

The process of assembling a package by mounting dies (semiconductor chips, to be simply referred to as "dies" hereinafter) on a substrate such as a wiring board or a lead frame includes the step of dividing a semiconductor wafer (to be simply referred to as "wafer" hereinafter) into dies and the die bonding step of mounting the obtained dies on the substrate.

The bonding step includes the step of stripping the obtained dies from the wafer. In this stripping step, these dies are stripped from a dicing film held by a pick-up device one by one and carried onto the substrate by using an adsorption jig called "collet".

Examples of the related art that carries out this stripping step include technologies disclosed by Japanese Patent Application Laid-Open Publication Nos. 2002-184836 and 2007-42996. Japanese Patent Application Laid-Open Publication No. 2002-184836 discloses a technology in which dies are stripped by mounting first tossing pins installed at the four corners of each die and second tossing pins installed at the center or peripheral portion of each die and having lower ends than the ends of the first tossing pins on a pin holder and raising the pin holder.

Japanese Patent Application Laid-Open Publication No. 2007-42996 discloses a technology in which three blocks that can be tossed higher as they are closer to the center portion of each die are installed, projections that project in the corner directions of each die and are integrated with the four corners of the outermost block are further installed, and the three blocks are tossed one by one.

SUMMARY OF THE INVENTION

Packages are becoming thinner and thinner in order to promote the high-density packaging of semiconductor devices. Particularly, a stacked package that mounts plural dies on the wiring board of a memory card three-dimensionally is now put to practical use. For the assembly of this stacked package, the thickness of each die must be made as thin as 20 μm or less in order to prevent an increase in the thickness of the package.

When the die becomes thin, the stiffness of the die becomes extremely low as compared with the adhesive force of the dicing film. Therefore, the dies are stripped at once even in the multiple tossing pin system of the Japanese Patent Application Laid-Open Publication No. 2002-184836 in which the first and second tossing pins differ from each other in height and the multiple block system having projections of the Japanese Patent Application Laid-Open Publication No. 2007-42996.

However, the tension of the dicing film differs according to the position of the die in fact. For example, the center portion of the wafer has low tension and the peripheral portion of the wafer has high tension. Further, a portion near adjacent dies that have been picked up has low tension and a portion near adjacent dies that are not picked up yet has high tension.

In the related art, the dies are picked up based on the condition that the tension of the dicing film fixed to the wafer ring of the pick-up device is constant everywhere. Therefore, the pick-up operation becomes unstable according to the position of the wafer and the pick-up condition and accordingly, many pick-up mistakes occur.

It is an object of the present invention which has been made in view of the above problem to provide a pick-up method and a pick-up device capable of stripping a die without fail.

The pick-up method of a die bonder according to an aspect of the present invention comprises the steps of, determining the tossing amount of a die to be stripped out of plural dies bonded to a dicing film with reference to a mapping table having information on a tossing amount corresponding to the position on the dicing film of the die, adsorbing the die by means of a collet, and tossing the dicing film of the die by the determined tossing amount to strip the die from the dicing film.

In the pick-up method of a die bonder according to an aspect of the present invention, preferably, the tension of the dicing film is measured in advance, and a tossing amount based on the measured tension is recorded in the mapping table.

In the pick-up method of a die bonder according to an aspect of the present invention, the tossing amount based on the tension of the dicing film is recorded in the mapping table in advance, the tension of the dicing film is measured when the die is stripped from the dicing film, the tossing amount corresponding to the measured tension is determined with reference to the mapping table, and the dicing film of the die is tossed by the determined tossing amount to strip the die from the dicing film.

Further, in the pick-up method of a die bonder according to an aspect of the present invention, the mapping table further includes information on whether the die is the quality item or the defective good.

A die bonder according to an aspect of the present invention comprises an expand ring that holds a wafer ring, a holding unit that is held by the wafer ring and holds a dicing film bonded to plural dies, a mapping table that records a tossing amount corresponding to the measured tension of the dicing film in connection with the positions of the dies of the wafer ring in advance, a position recognition unit that recognizes the position of a die to be stripped, a stripping unit that reads the tossing amount corresponding to the recognized position with reference to the mapping table and tosses the dicing film by the read tossing amount to strip the die to be stripped from the dicing film, and a tossing unit having a drive unit that drives the tossing of the stripping unit.

A die bonder according to an aspect of the present invention includes an expand ring that holds a wafer ring, a holding unit that is held by the wafer ring and holds a dicing film bonded to plural dies, a stripping unit that tosses the dicing film by the read tossing amount to strip a die to be stripped from the dicing film, a tossing unit having a drive unit that drives the tossing of the stripping unit, and a load cell that measures the tossing reactive force of the stripping unit, wherein the stripping unit can change the tossing amount based on the measured reactive force.

The die bonder of the present invention has a mapping table that records information on a tossing amount corresponding to the reactive force in connection with the positions of the dies of the wafer ring in advance, and the stripping unit reads the tossing amount based on the measured reactive force with reference to the mapping table and tosses the dicing film by the read tossing amount to strip the die to be stripped from the dicing film.

BRIEF DESCRIPTION OF THE DRAWINGS

FIG. 9 is a flow chart showing the processing flow of pick-up operation according to an embodiment of the present invention.

DETAILED DESCRIPTION OF THE EMBODIMENT

Figure 8A:
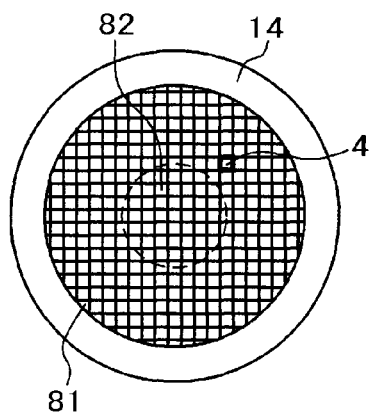
FIG. 8A is a diagram for explaining the difference in tension at the time of pick-up between the center portion and the peripheral portion of the wafer within a wafer ring.
Figure 8C:
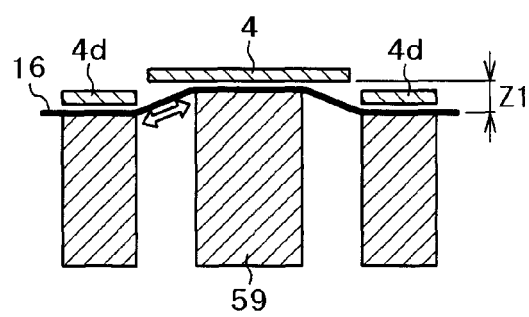
FIG. 8C is a diagram for explaining the difference in tension at the time of pick-up between the center portion and the peripheral portion of the wafer within the wafer ring.
Figure 8B:
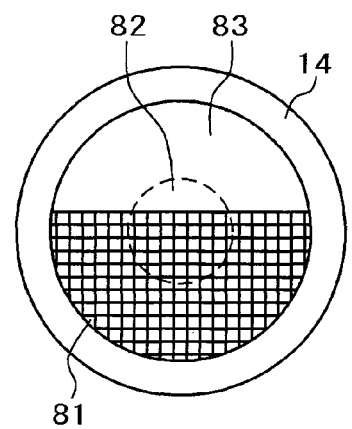
FIG. 8B is a diagram for explaining the difference in tension at the time of pick-up between the center portion and the peripheral portion of the wafer within the wafer ring.

FIGS. 8A, 8B, 8C and 8D are diagrams for explaining the difference in tension at the time of pick-up between the central portion 82 and the peripheral portion of a wafer 81 within a wafer ring 14. As shown in FIG. 8A, even when the pick-up of dies from the wafer 81 is not started yet and most of the dies (shown as rectangular within the wafer 81) remain, the tension of a dicing film 16 is lower in the center portion 82 than in the peripheral portion (near the expand ring 15 of the wafer ring 14). Further, as shown in FIG. 8B, when half of the dies remain, the tension of the dicing film 16 becomes lower as it is closer to a portion where no dies remain.

Figure 8D:
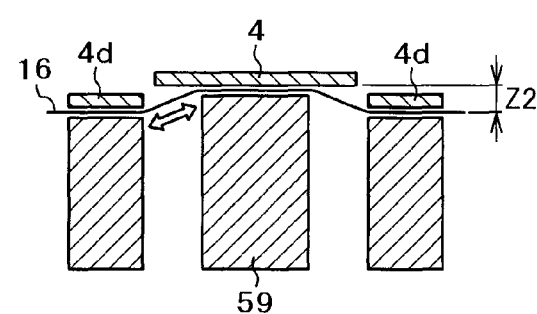
FIG. 8D is a diagram for explaining the difference in tension at the time of pick-up between the center portion and the peripheral portion of the wafer within the wafer ring.

In this case, when the tension of the dicing film 16 is high, the tossing amount Z may be a small tossing amount Z1 as shown in FIG. 8C. However, when the tension of the dicing film 16 is low, the tossing amount Z must be raised to a large tossing amount Z2 as shown in FIG. 8D.

Thus, tension varies according to the positions and number of dies existent on the dicing film. However, when the pick-up height (tossing amount Z) is fixed (Z1=Z2) like the related art pick-up system, the tossing amount cannot be changed according to varying tension and accordingly, stripping variations occur by tossing. The variations have an effect on pick-up stability. In the present invention, the tossing amount is corrected in consideration of the position of the die on the wafer and the situation around the die (Z1≠Z2). As a result, the pick-up stability is improved by maintaining fixed tension at the time of pick-up and suppressing stripping variations caused by tossing.

First Embodiment

An exemplary embodiment of the present invention will be described with reference to the drawings.

Figure 1:
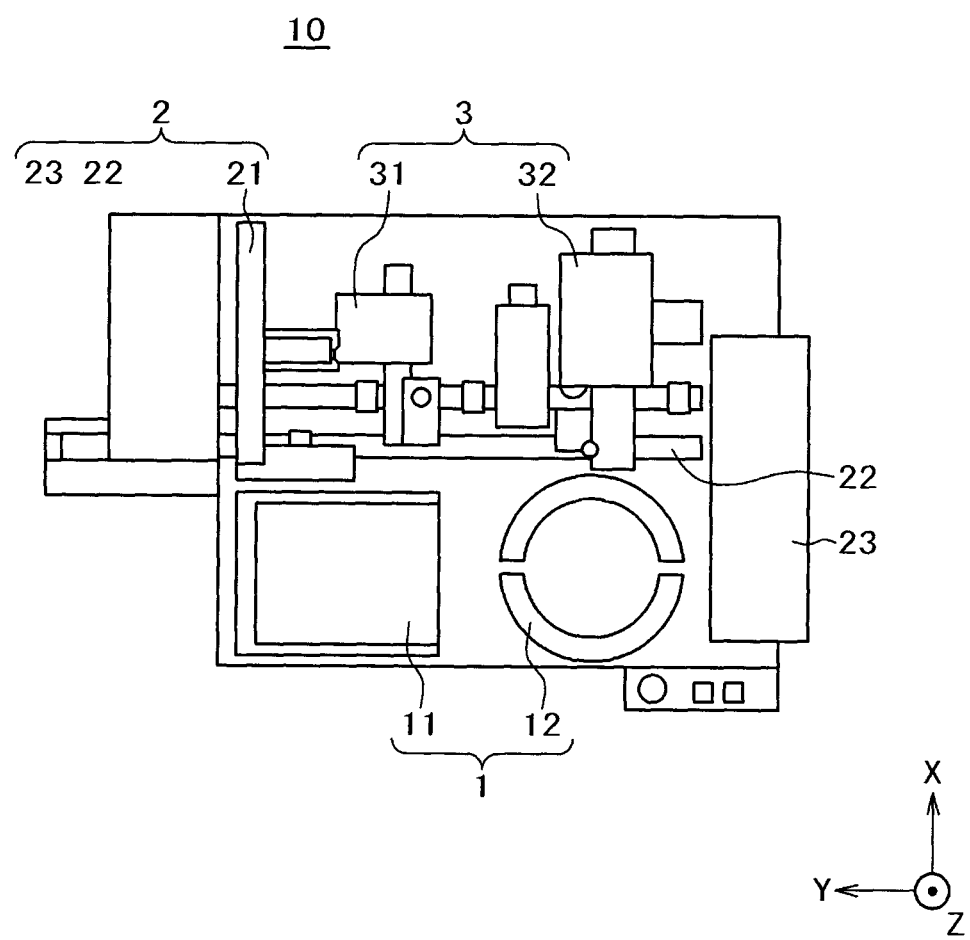
FIG. 1 is a conceptual diagram of a die bonder according to an embodiment of the present invention when it is seen from above.

FIG. 1 is a conceptual diagram of a die bonder 10 using embodiments of a pick-up method and a pick-up device of the present invention when it is seen from above. Roughly speaking, the die bonder 10 has a wafer supply unit 1, a workpiece supply/conveying unit 2 and a die bonding unit 3.

The workpiece supply/conveying unit 2 has a static loader 21, a frame feeder 22 and an unloader 23. A workpiece (lead frame) supplied to the frame feeder 22 by the stack loader 21 is carried to the unloader 23 through two processing positions on the frame feeder 22.

The die bonding unit 3 has a preforming unit 31 and a bonding head unit 32. The preforming unit 31 applies a die adhesive to the workpiece carried by the frame feeder 22. The bonding head unit 32 picks up a die from a pick-up device 12, goes up and moves the die horizontally to a bonding point on the frame feeder 22. Then, the bonding head unit 32 lowers the die and bonds the die on the workpiece to which the die adhesive has been applied.

The wafer supply unit 1 has a wafer cassette lifter 11 and the pick-up device 12. The wafer cassette lifter 11 has a wafer cassette (not shown) filled with wafer rings and supplies the wafer rings to the pick-up device 12 one by one.

Not shown in FIG. 1, the die bonder 10 further includes a controller that controls the die bonder 10 and the pick-up device, a drive mechanism, a recognition processing unit and a monitor and communicates with the controller and other units through an interface. The controller is a CPU (Central Processing Unit) and includes a RAM (Random Access Memory) and a ROM (Read Only Memory).

The constitution of the pick-up device 12 will be described with reference to FIG. 2 and FIG. 3.

Figure 2:
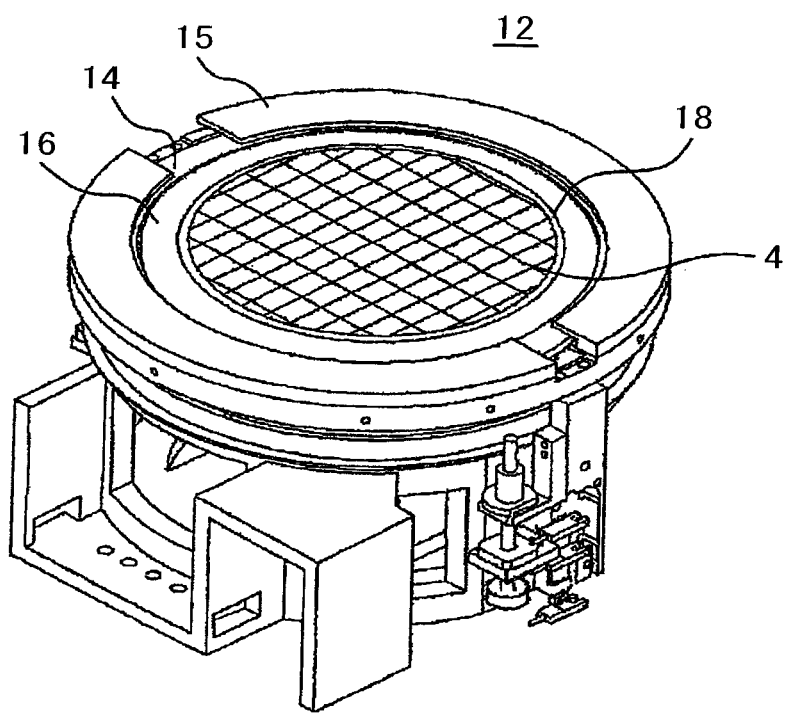
FIG. 2 is a perspective view of the appearance of a pick-up device according to an embodiment of the present invention.
Figure 3:
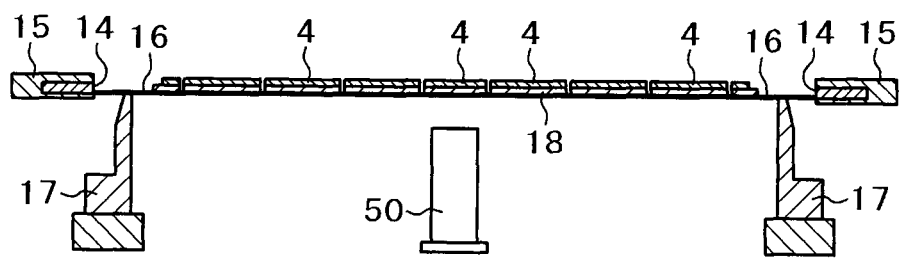
FIG. 3 is a schematic sectional view of the key part of the pick-up device according to the embodiment of the present invention.

FIG. 2 is a perspective view of the appearance of the pick-up device 12. FIG. 3 is a schematic section view of the key part of the pick-up device 12. As shown in FIG. 2 and FIG. 3, the pick-up device 12 has an expand ring 15 that holds a wafer ring 14, a support ring 17 that horizontally positions a dicing film 16 that is held by the wafer ring 14 and to which plural dies (chips) 4 are bonded, and a tossing unit 50 that is arranged on the inner side of the support ring 17 and tosses dies 4 in an upward direction. The tossing unit 50 is moved in a vertical direction by an unshown drive mechanism, and the pick-up device 12 moves in a horizontal direction.

The pick-up device 12 lowers the expand ring 15 that holds the wafer ring 14 at the time of tossing the dies 4. As a result, the dicing film 16 held by the wafer ring 14 is stretched to expand the spaces between adjacent dies 4, and the dies 4 are tossed by the tossing unit 50 from the bottom, thereby improving the pick-up capability of the dies 4. The adhesive is changed from a liquid to a film as the wafer and the dies 4 become thin. A film-like adhesive material called "die attach film 18" is attached between the wafer and the dicing film 16. In a wafer having this die attach film 18, dicing is carried out on the wafer and the die attach film 18. Therefore, in the stripping step, the wafer and the die attach film 18 are stripped from the dicing film 16.

Figure 4:
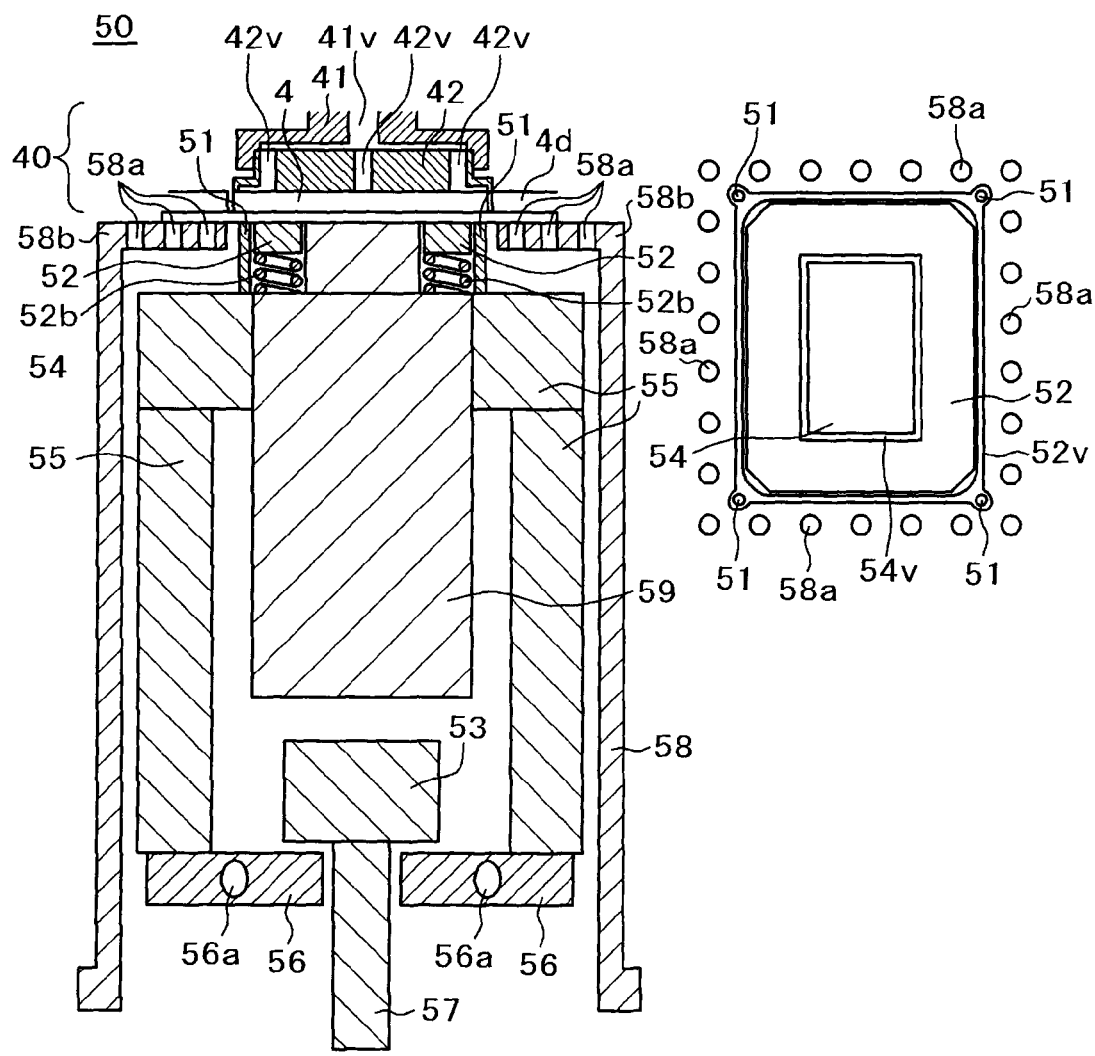
FIG. 4A is a diagram showing the constitution of a tossing unit and the collet unit of a bond head unit according to a first embodiment of the present invention.
FIG. 4B is a top view of a portion where the tossing block unit and stripping start point forming pins of a tossing unit are existent according to the first embodiment of the present invention.

FIG. 4A shows the constitution of the tossing unit 50 and the collet unit 40 of the bond head unit (not shown) according to a first embodiment of the present invention. FIG. 4B is a top view of a portion where the tossing block unit and stripping start point forming pins that will be described hereinafter of the tossing unit are existent (refer to FIGS. 6A to 6D and FIGS. 7A to 7D and also the explanations of FIGS. 6A to 6D and FIGS. 7A to 7D).

As shown in FIG. 4A, the collet unit 40 includes a collet 42, a collet holder 41 that holds the collet 42, and suction holes 41v and 42v that adsorb the dies 4 and are formed in the collet holder 41 and the collet 42, respectively.

Meanwhile, roughly speaking, the tossing unit 50 has a tossing block unit, a stripping start point forming pin unit, a drive unit that drives the tossing block unit and the stripping start point forming pin unit, and a dome body 58 that holds these units. The tossing block unit has a block body 59, an inner block 54 that is directly connected to the block body 59, and an outer block 52 that is installed around the inner block through a ½ switch spring 52b and has a smaller outer shape than the outer shape of the die 4.

The stripping start point forming pin unit has four stripping start point forming pints 51 that are installed outside the four corners of the outer block 52, that is, at the four corners of the die, a pin vertical link 55 that holds the stripping start point forming pins 51 and can move in a vertical direction, and pin drive links 56 that turn on a turning fulcrum 56a to move the pin vertical link 55 in a vertical direction.

The drive unit has a drive shaft 57 that is moved vertically by a motor and an operating body 53 that is moved vertically by the vertical movement of the drive shaft 57. When the operating body 53 goes down, the pin drive links 56 turn, and the pin vertical link 55 goes up to toss the stripping start point forming pins 51. When the operating body 53 goes up, the block body is moved up to drive up the outer and inner blocks. The pin vertical link 55 and the pin drive links 56 constitute an inverting unit that changes the downward movement of the operating body 53 to the tossing (upward movement) of the stripping start point forming pins 51 according to the above explanation.

The upper part of the dome body 58 has a dome head 58b with many adsorption holes 58a that adsorb and hold the dies 4. FIG. 4B shows only one row of the adsorption holes 58a around the block unit but plural rows of adsorption holes 58a are formed to stably hold dies 4d not to be picked up. As shown in FIG. 4B, the space 54v between the inner block 54 and the outer block 52 and the space 52v between the outer block 52 and the dome head 58b are suctioned to hold the dicing film 16 on the side of the block unit.

Figure 5:
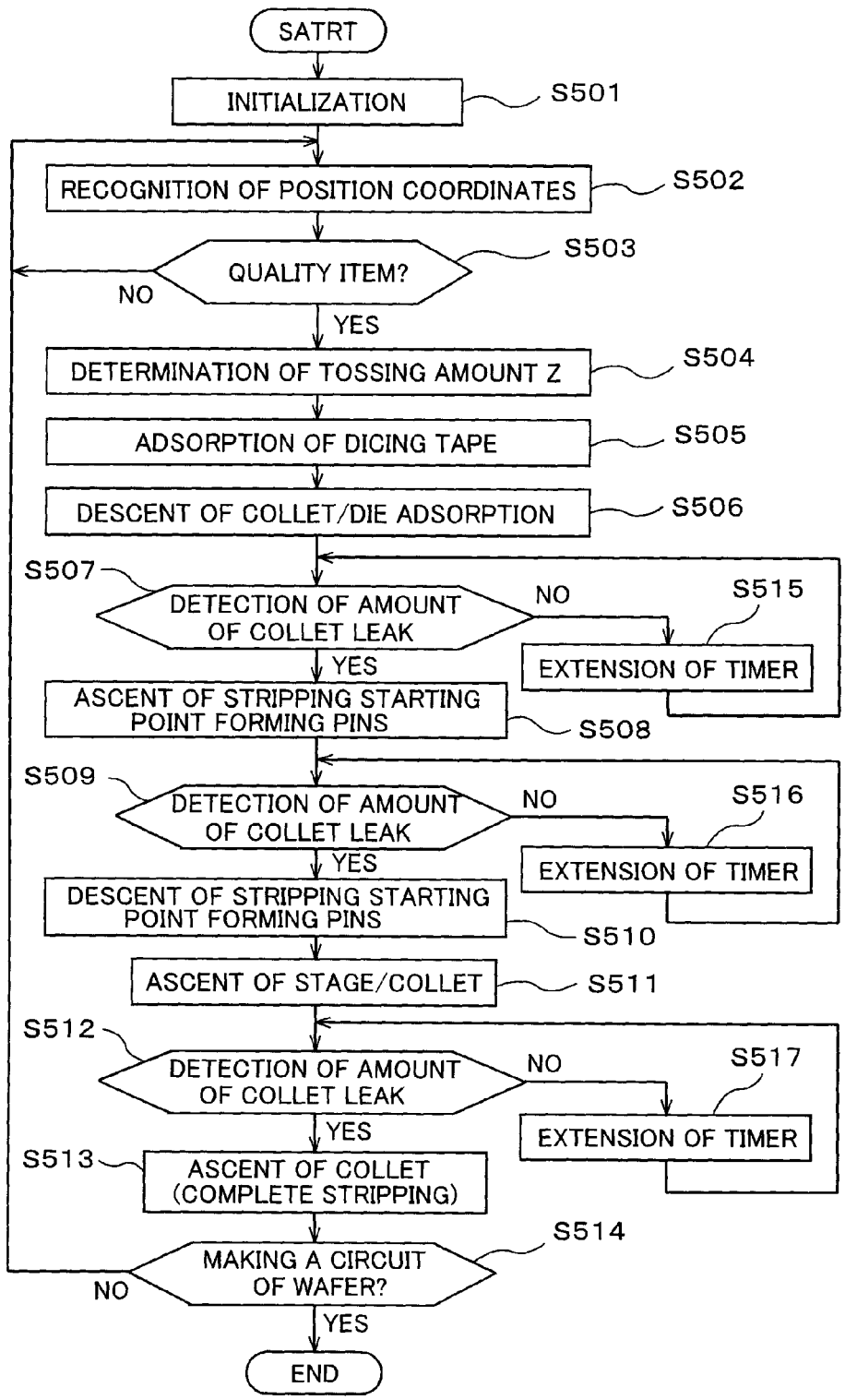
FIG. 5 is a flow chart showing the processing flow of pick-up operation according to the embodiment of the present invention.

The pick-up operation of the above-described tossing unit 50 will be explained with reference to FIG. 5, FIGS. 6A to 6D and FIGS. 7A to 7D. FIG. 5 is a flow chart showing the processing flow of the pick-up operation. FIGS. 6A to 6D are diagrams showing the operations of a portion near the dome head 58b and the collet unit 40 according to the first embodiment of the present invention. FIGS. 7A to 7D are diagrams mainly showing the drive operation of the tossing unit 50 at the time of the pick-up operation of the die 4 according to the first embodiment of the present invention. FIGS. 6A to 6D and FIGS. 7A to 7D show operations at the same times, respectively.

In the step 501, initialization is first carried out. Initialization is carried out when one wafer is set in the pick-up device. For example, for initialization, the bonding head unit 32, the wafer ring 14, the expand ring 15, the support ring 17 and the tossing unit 50 are returned to the reference positions (including the vertical direction). Then, in the step 501, a mapping table having information on whether the die of the wafer set in the wafer ring is the quality item (OK) or the defective good (NG) and the coordinates of the center positions of the dies and the tossing amount Z is read into an external memory device or a ROM. The above initially set values and the mapping table are read and recorded in the memory device (such as RAM) of the controller that controls the die bonder comprising the pick-up device. ROM is one of the memory devices of the controller (see FIG. 1). The information on the tossing amount Z recorded in the mapping table is a tossing amount recorded based on the measured tension of the dicing film. Further, every time each one of the dies on one wafer is picked up, the tension of the dicing film may be measured when a die to be stripped next is picked up so that the tossing amount is determined to obtain constant tension.

The processing flow of FIG. 5 is carried out by the control of the die bonder and the pick-up device by means of the controller.

In the subsequent step S502, the die 4 to be taken out by the pick-up device is imaged by a recognition camera (not shown) to recognize the position of the die 4 by a recognition processing unit (not shown).

In the step S503, it is judged whether the die 4 is the quality item or the defective good from information on the die 4 corresponding to the recognized position with reference to the mapping table. When the die 4 is the defective good, the routine returns to the step S502 to recognize the position of the next die. When the die 4 is the quality item, the routine proceeds to the step S504.

In the step S504, the tossing amount Z is read from information on the die 4 corresponding to the die 4, and the read value is determined as the tossing amount of the die 4.

Figure 6A:
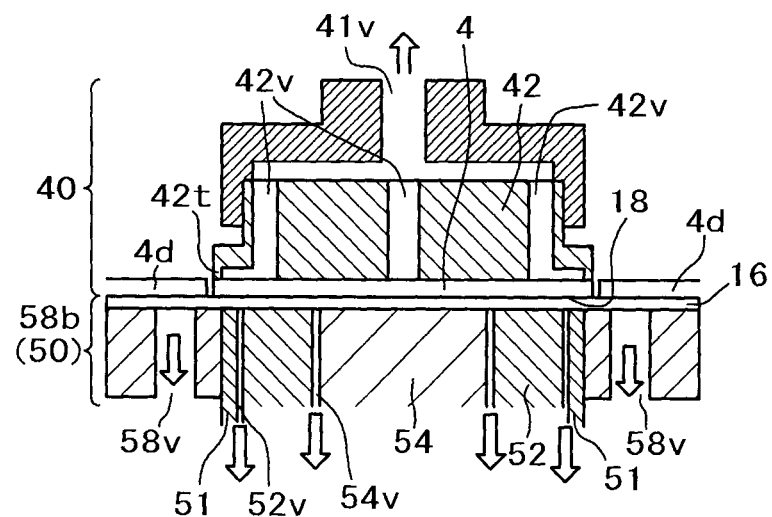
FIG. 6A is a diagram showing the operations of a portion near a dome head and a collet unit according to an embodiment of the present invention.

In the subsequent step S505, as shown in FIG. 6A, the stripping start point forming pins 51, the outer block 52 and the inner block 54 are made flush with the surface of the dome head 58b, and the dicing film 16 is adsorbed by means of the adsorption holes 58a of the dome head 58b and the spaces 52v and 54v between the blocks.

In the subsequent step S506, the collet unit 40 is lowered and positioned above a die 4 to be picked up, and the die 4 is adsorbed by means of the suction holes 41v and 42v.

Figure 7A:
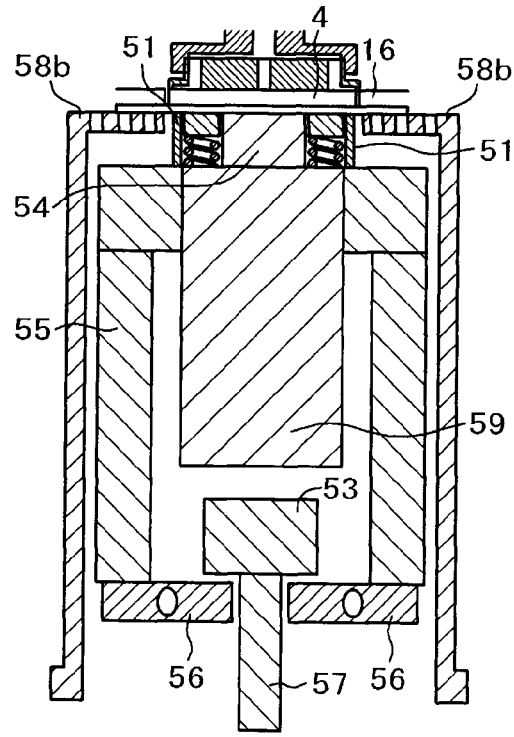
FIG. 7A is a diagram mainly showing the drive operation of a tossing unit at the time of the pick-up operation of the die according to an embodiment of the present invention.

The state shown in FIG. 6A is obtained by the steps S505 and S506. At this point, the drive operation is neutral in which the operating body 53 does not activate the stripping start point forming pins 51 and the blocks 52 and 54 as shown in FIG. 7A.

In this state, in the step S507, the air flow is detected to check if there is a leak from the collar 42t of the collet 42 or not. When the leak falls within a normal range, the routine proceeds to the step S508 and when the leak does not fall within a normal range, the routine proceeds to the step S515.

In the step S515, a timer is extended to return to the step S507. Thus, in the steps S507 and S515, suction is continued until the leak falls within a normal range.

In the subsequent step S508, only the stripping start point forming pins 51 installed at the four corners of the outer block 52 are lifted by several tens of μm to several hundreds of μm.

Figure 6B:
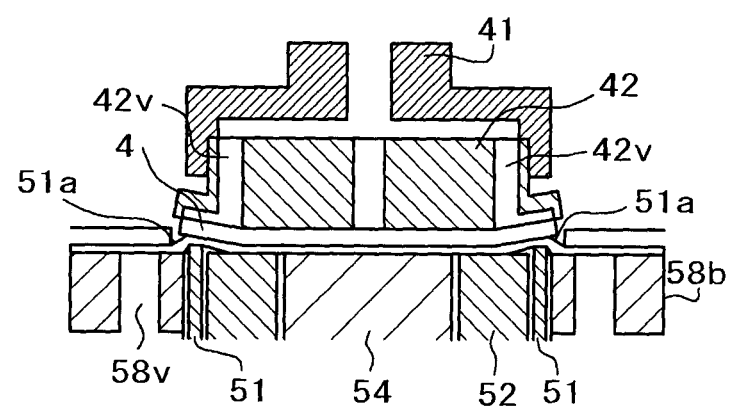
FIG. 6B is diagram showing the operations of the portion near the dome head and the collet unit according to the embodiment of the present invention.

As a result, as shown in FIG. 6B, rising portions of the dicing film 16 are formed around the stripping start point forming pins 51, and very small spaces, that is, stripping start points 51a are formed between the dicing film 16 and the die attach film 18. An anchor effect, that is, stress applied to the die 4 is greatly reduced by the spaces, thereby making it possible to ensure the stripping operation in the subsequent step.

Figure 7B:
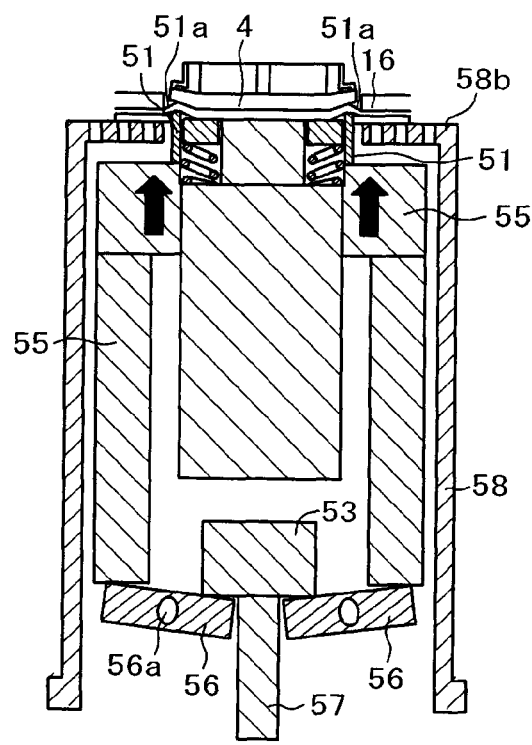
FIG. 7B is a diagram mainly showing the drive operation of the tossing unit at the time of the pick-up operation of the die according to the embodiment of the present invention.

FIG. 7B shows the driving operation at this point. The operating body 53 goes down, and the pin drive links 56 turn on the fulcrum 56a to lift the pin vertical link 55, thereby tossing the stripping start point forming pins 51.

As long as the stripping start point forming pins 51 can form the very small spaces as described above, the tossing pins may have a diameter of 700 μm or less and a round or flat end.

In the subsequent step S509, like the step S507, the air flow is detected to check if there is a leak from the collar 42t of the collet 42 or not. When the leak falls within a normal range, the routine proceeds to the step S510 and when the leak does not fall within a normal range, the routine proceeds to the step S516.

In the step S516, the timer is extended to return to the step S509. Thus, in the steps S509 and S516, suction is continued until the leak falls within a normal range.

In the step S510, the operating body 53 is lifted to return the positions of the stripping start point forming pins 51 to the original positions. The stripping start point forming pins 51 do not contribute to the stripping operation of the die 4 after the subsequent step.

In the subsequent step S511, the die 4 stripping operation of the outer block 52 and the inner block 54 is started. To this end, as shown in FIG. 7C, the operating body 53 is further lifted to carry out the stripping operation of the outer block 52 and the inner block 54.

Figure 6C:
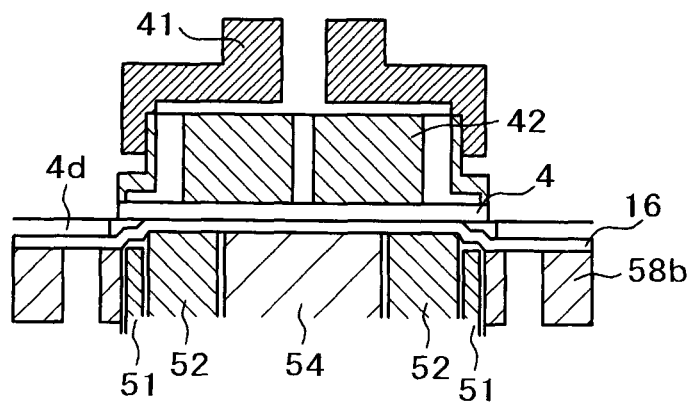
FIG. 6C is diagram showing the operations of the portion near the dome head and the collet unit according to the embodiment of the present invention.
Figure 6D:
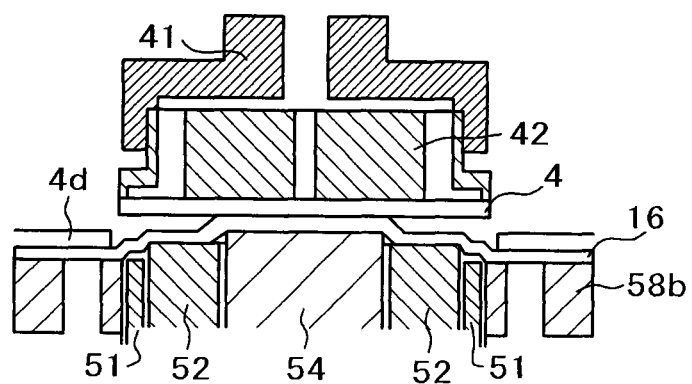
FIG. 6D is a diagram showing the operations of the portion near the dome head and the collet unit according to the embodiment of the present invention.

At this point, the state of a portion near the dome head 58b and the collet unit 40 is as shown in FIG. 6C. Also in the step S512, the detection of a collet leak is carried out like the steps S507 and S509. That is, in the step S512, the air flow is detected to check if there is a leak from the collar 42t of the collet 42 or not. When the leak falls within a normal range, the routine proceeds to the step S513 and when the leak does not fall within a normal range, the routine proceeds to the step S517.

In the step S517, the timer is extended to return to the step S512. Thus, suction is continued until the leak falls within a normal range.

Figure 7C:
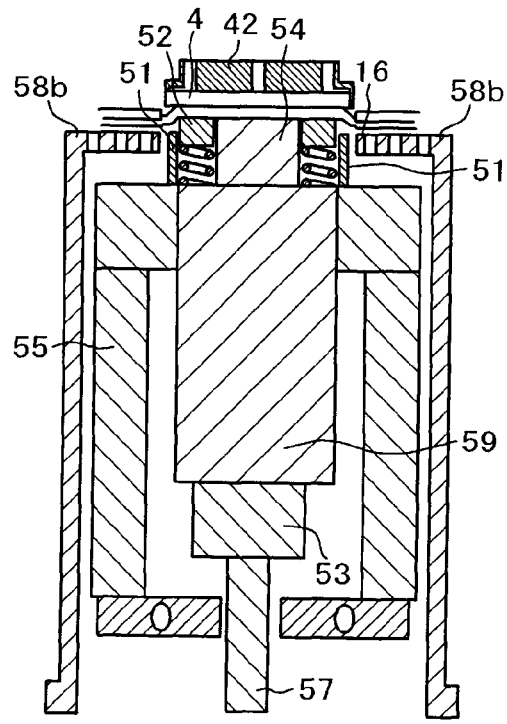
FIG. 7C is a diagram mainly showing the drive operation of the tossing unit at the time of the pick-up operation of the die according to the embodiment of the present invention.
Figure 7D:
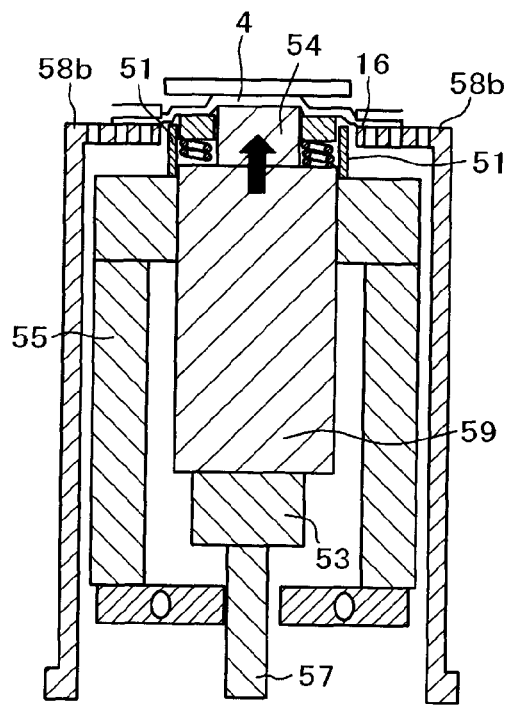
FIG. 7D is a diagram mainly showing the drive operation of the tossing unit at the time of the pick-up operation of the die according to the embodiment of the present invention.

In the subsequent step S513, as shown in FIG. 7D, the operating body 53 is further lifted from the state shown in FIG. 7C. As a result, only the inner block 54 is lifted by the function of the ½ switch spring 52b to achieve the state shown in FIG. 6D. In this state, the contact area between the dicing film 16 and the die 4 becomes an area that enables the die 4 to be stripped by the ascent of the collet so that the die 4 is stripped by the ascent of the collet 42.

In the step S514, it is judged whether the above steps S502 to S513 have been carried out on all the dies of one wafer set in the pick-up device. When all the above steps have not been carried out, the routine returns to the step S502 and when all the above steps have been carried out, the processing flow of FIG. 5 is ended.

As having been described above, according to the embodiment shown in FIG. 1 to FIGS. 4A and 4B, FIG. 5, FIGS. 6A, 6B, 6C and 6D, and FIGS. 7A, 7B, 7C and 7D, the stripping start point forming pins 51 are installed at positions corresponding to the four corners of the die 4 and lifted in the initial stage of the stripping step to form spaces as stripping start points so as to reduce stress applied to the die 4, thereby making it possible to carry out the subsequent stripping step surely without breaking the die 4. As a result, a die bonder or a pick-up method that can suppress a pick-up mistake and has high reliability can be provided.

Second Embodiment

Figure 10:
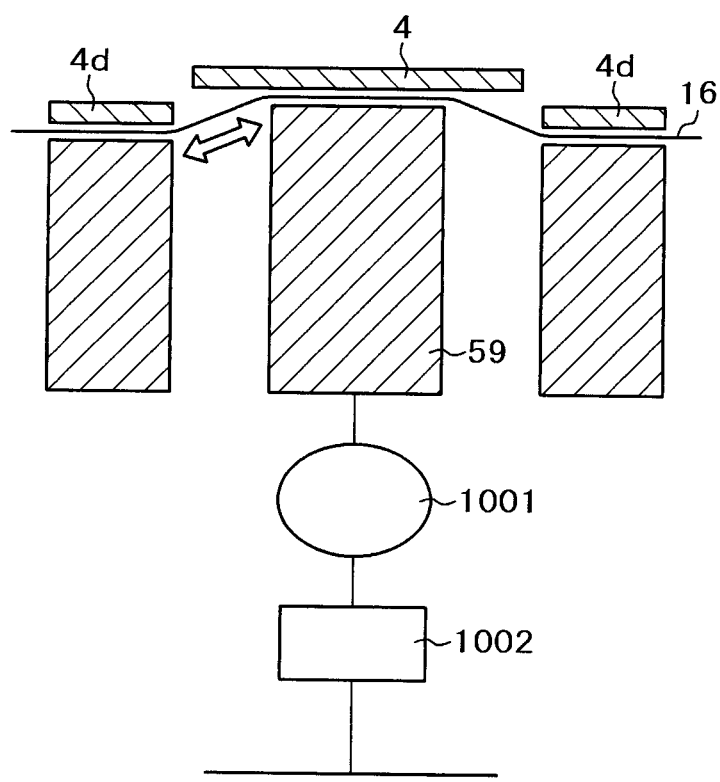
FIG. 10 is a diagram for explaining the correction of tension at the time of pick-up between the center portion and the peripheral portion of the wafer within the wafer ring according to an embodiment of the present invention.

A second embodiment of the present invention will be described with reference to FIG. 9 and FIG. 10. FIG. 1 to FIGS. 4A and 4B, FIG. 5, FIGS. 6A, 6B, 6C and 6D, and FIGS. 7A, 7B, 7C and 7D are also used for the second embodiment. FIG. 9 is a flow chart showing the processing flow of the pick-up operation in this embodiment of the present invention. FIG. 10 is a diagram that explains the correction of tension in the center portion and the peripheral portion of the wafer within the wafer ring at the time of pick-up according to this embodiment of the present invention.

In the second embodiment of the present invention, load (reactive force) at the time of tossing is measured to change the tossing amount so that load at the time of tossing becomes constant.

In FIG. 10, a vertical mechanism 1002 (refer to the operating body 53 and the drive shaft 57 in FIG. 4A) drives up the block body (see FIG. 4A) to carry out tossing, and a load cell 1001 measures reactive force (load) from the dicing film 16. The measured load is transmitted to the control unit of the unshown controller. The control unit controls the vertical mechanism 1002 to set the measured load to a predetermined value.

FIG. 9 is a flow chart showing the processing flow of the pick-up operation in the second embodiment.

The flow chart of FIG. 9 differs from the flow chart of FIG. 5 in the following points and is the same as the flow chart of FIG. 5 in other points. The same processings are omitted as they have been explained with reference to FIG. 5. The controller controls the die bonder and the pick-up device to carry out the processing flow of FIG. 9 as well.

That is, in FIG. 9, initialization that is carried out in the step S901 is carried out when one wafer is set in the pick-up device. For example, initialization is the same as in FIG. 5 in that the bonding head unit 32, the wafer ring 14, the expand ring 15, the support ring 17 and the tossing unit 50 are returned to the reference positions (including the vertical direction). In the step 901, the mapping table having information on whether the die of the wafer set in the wafer ring is the quality item (OK) or the defective good (NG), the coordinates of the center positions of the dies and the tossing amount Z' corresponding to the measured load is read into an external memory device or a ROM. The above initially set values and the mapping table are read and recorded in the memory device (for example, RAM) of the controller (that will be described hereinafter) that controls the die bonder having the pick-up device. ROM is one of the memory devices of the above controller.

In FIG. 9, there is no processing of the step S504 and when it is judged that the die is the quality item in the step S503, the step S505 is carried out.

In the step S911 as a substitute for the step S511, in the processing of lifting the stage and the collet, the tossing amount is changed according to the measured load.

As a result, according to the second embodiment, the measurement of tension at the time of preliminary mapping is unnecessary.

It is further understood by those skilled in the art that the foregoing description is exemplary embodiments of the present invention and that various substitutions, changes and modifications may be made in the invention without departing from the spirit and scope thereof.

What is claimed is:

1. A pick-up method of a die bonder, comprising:
   determining a tossing amount of a die to be stripped out of a plurality of dies bonded to a dicing film with reference to a mapping table having tossing amount information recorded based on a measured tension of the dicing film and corresponding information on a position of the die and number of dies existing around the die on the dicing film;
   adsorbing the die by way of a collet and the dicing film by a dome head; and
   tossing the dicing film to which the die is bonded by the tossing amount determined in order to strip the die from the dicing film.

2. The pick-up method of a die bonder according to claim 1, comprising measuring a tension of the dicing film in advance, and recording the tossing amount in the mapping table based on the tension measured.

3. The pick-up method of a die bonder according to claim 2, wherein the mapping table further includes information on whether the die is of adequate quality or defective.

4. The pick-up method of a die bonder according to claim 1, wherein the mapping table further includes information on whether the die is of adequate quality or defective.

5. The pick-up method of a die bonder according to claim 1, further comprising lifting stripping start point forming pins at certain positions.

6. The pick-up method of a die bonder according to claim 1, wherein adsorbing the die by way of the collet occurs after adsorbing the dicing film by the dome head.

7. A pick-up method of a die bonder, comprising:
   determining a tossing amount of a die to be stripped out of a plurality of dies bonded to a dicing film with reference to a mapping table having tossing amount information recorded based on a measured tension of the dicing film and corresponding information on a position of the die and number of dies existing around the die on the dicing film;
   adsorbing the die by way of a collet and the dicing film by a dome head;
   tossing the dicing film to which the die is bonded by the tossing amount determined in order to strip the die from the dicing film; and
   measuring tension of the dicing film after the die stripped, and recording the tossing amount in the mapping table based on the tension of the dicing film measured.

* * * * *